United States Patent
Dollinger et al.

(10) Patent No.: US 6,813,947 B2
(45) Date of Patent: Nov. 9, 2004

(54) PRODUCT HAVING A SENSOR AND A SURFACE ACOUSTIC WAVE ELEMENT, AS WELL AS A METHOD AND ARRANGEMENT FOR DETERMINING A MEASUREMENT VARIABLE, WHICH CORRESPONDS TO A REACTANCE, BY A SENSOR

(75) Inventors: Franz Dollinger, Unterhaching (DE); Gernot Schimetta, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/780,051

(22) Filed: Feb. 17, 2004

(65) Prior Publication Data

US 2004/0159154 A1 Aug. 19, 2004

Related U.S. Application Data

(63) Continuation of application No. 10/230,856, filed on Aug. 29, 2002, now abandoned, which is a continuation of application No. PCT/DE01/00846, filed on Mar. 6, 2001.

(30) Foreign Application Priority Data

Mar. 6, 2000 (DE) ........................................ 100 10 846

(51) Int. Cl.⁷ ............................................. G01F 15/06
(52) U.S. Cl. ................. 73/432.1; 310/313 R; 340/10.1; 340/825.72; 340/870.16
(58) Field of Search ............................... 73/570, 19.03, 73/24.01, 24.06, 31.06, 61.79, 64.53, 432.1; 310/313 R, 313 B; 340/825.53, 825.72, 10.1, 870.3, 870.16, 664, 572.1; 342/42, 44, 50, 51

(56) References Cited

U.S. PATENT DOCUMENTS

| | | | |
|---|---|---|---|
| 5,691,698 A | * 11/1997 | Scholl et al. | 340/572.5 |
| 5,966,008 A | * 10/1999 | Maier et al. | 324/96 |
| 6,084,503 A | * 7/2000 | Ruile et al. | 340/10.1 |
| 6,144,332 A | * 11/2000 | Reindl et al. | 342/42 |
| 6,556,146 B1 | * 4/2003 | Ruile et al. | 340/870.3 |
| 6,664,708 B2 | * 12/2003 | Shlimak et al. | 310/313 R |
| 2002/0130587 A1 | * 9/2002 | Shlimak et al. | 310/313 R |

FOREIGN PATENT DOCUMENTS

| | | | |
|---|---|---|---|
| DE | 19828170 A1 | 12/1999 | G08C/17/02 |
| DE | 19851002 A1 | 5/2000 | H03H/9/145 |
| EP | 0 450653 | 10/1991 | B60C/23/00 |
| EP | 0 883327 | 12/1998 | H05B/3/74 |
| JP | 59017127 | 1/1984 | G01L/17/00 |
| WO | WO 96/33417 | * 10/1996 | G01R/15/20 |
| WO | WO 96/33423 | * 10/1996 | G01S/13/75 |
| WO | WO97/45277 A | 12/1997 | B60C/23/04 |

OTHER PUBLICATIONS

"SAW Delay Lines for Wirelessly Requestable Conventional Sensors" by R. Steindl, A. Pohl, L. Reindl und F. Siefert, 1998 IEEE Ultrasonics Symposium, Proceedings, Seiten pp. 351–354.

"Wirelessly Interrogable Sensors for Different Purposes in Industrial Radio Channels", 1998 IEEE Ultrasonics Symposium, Proceedings, pp. 347–350, Jul. 1998.

(List continued on next page.)

Primary Examiner—Hezron Williams
Assistant Examiner—Rose M. Miller
(74) Attorney, Agent, or Firm—Baker Botts L.L.P.

(57) ABSTRACT

The product comprises a sensor (1) via which a measured quantity that corresponds to reactive resistance can be furnished within a measuring range. The product also comprises a matching network (2) and a surface wave element (3). The sensor (1) is connected to a first reflector (4) of the surface wave element (3) via the matching network (2). The first reflector (4) forms, together with the matching network (2) and the sensor (1), a resonator which, for a value of the measured quantity within the measuring range, has a resonance with regard to a reflection of an acoustic surface wave on the first reflector (4). The invention also relates to a method for determining the measured quantity and to a corresponding system.

15 Claims, 2 Drawing Sheets

OTHER PUBLICATIONS

"Funksensorik und Identifikation mit OFW–Sensoren" by L. Reindl, G. Scholl, T. Ostertag, F. Schmidt und A. Pohl, vorgetragen auf der ITG/GMA–Fachtagung "Sensoren und Meβsysteme" zwischen dem 09. und dem Mar. 11, 1998 in Bad Nauheim pp. 1–10.

"Surface Acoustic Wave Filters for Digital Radio Relay Systems" by G. Riha, H. Stocker und P. Zibis, Telcom Report 10 (1987) Special "Radio Communication" pp. 241–246.

"Reproducible Fabrication of Surface Acoustic Wave Filters" by W. E. Bulst und E. Willibald–Riha, Telcom Report 10 (1987) Special "Radio Communication" pp. 247–252.

"Programmable Reflectors for SAW–ID–Tags" by L. Reindl und W. Ruile, 1983 IEEE Ultrasonics Symposium, Proceedings, Seiten pp. 125–130, 1993.

\* cited by examiner

PRODUCT HAVING A SENSOR AND A SURFACE ACOUSTIC WAVE ELEMENT, AS WELL AS A METHOD AND ARRANGEMENT FOR DETERMINING A MEASUREMENT VARIABLE, WHICH CORRESPONDS TO A REACTANCE, BY A SENSOR

CROSS REFERENCE TO RELATED APPLICATION

This application is a continuation of U.S. patent application Ser. No. 10/230,856 filed Aug. 29, 2002 now abandoned, which is a continuation of copending International Application No. PCT/DE01/00846 filed Mar. 6, 2001, and claiming a priority date of Mar. 6, 2000.

BACKGROUND OF THE INVENTION

The invention relates to a product having a sensor, by means of which a measurement variable which corresponds to a reactance and which is within a measurement range can be supplied, having a matching network and having a surface acoustic wave element, with the sensor being connected via the matching network to a first reflector in the surface acoustic wave element, and the first reflector together with the matching network and the sensor forming a resonator.

The invention also relates to a method for determining a measurement variable, which corresponds to a reactance, within a measurement range by a sensor, which is connected via a matching network to a first reflector in a surface acoustic wave element, and which, together with the first reflector and the matching network, forms a resonator. The method comprises the following steps:

a) production of a surface acoustic wave which propagates on the surface acoustic wave element;

b) production of a first reflected acoustic wave by reflection of the surface acoustic wave on the first reflector;

c) reception of the first reflected surface acoustic wave; and d) determination of the measurement variable from the first reflected surface acoustic wave.

The invention also relates to a corresponding arrangement.

A product such as this, a method such as this and an arrangement such as this are described in the article "SAW Delay Lines for Wirelessly Requestable Conventional Sensors" by R. Steindl, A. Pohl, L. Reindl and F. Seifert, IEEE Ultrasonics Symposium, Proceedings, pages 351 et seqq, see in particular FIGS. 1, 4 and 5 together with the associated description. Reference is additionally made to the article "Wirelessly Interrogable Sensors for Different Purposes in Industrial Radio Channels" by the same four authors who have been named, 1998 IEEE Ultrasonics Symposium, Proceedings, pages 347 et seqq, see in particular the chapter entitled "Radio Request Methods", page 349 et seq. Finally, reference is made to the article "Funksensorik und Identifikation mit OFW-Sensoren" [Radio sensor systems and identification using SAW sensors] by L. Reindl, G. Scholl, T. Ostertag, F. Schmidt and A. Pohl, presented at the ITG/GMA specialist conference on "Sensors and measurement systems" between Mar. 9 and 11, 1998 at Bad Nauheim, a written script of which lecture was provided. FIG. 18 of the script together with the associated description is of particular interest.

The above significant technological background also includes the articles "Surface Acoustic Wave Filters for Digital Radio Relay Systems" by G. Riha, H. Stocker and P. Zibis, Telcom Report 10 (1987) Special "Radio Communication" 241 and "Reproducible Fabrication of Surface Acoustic Wave Filters" by W. E. Bulst and E. Willibald-Riha, Telcom Report 10 (1987) Special "Radio Communication" 247. The article "Programmable Reflectors for SAW-ID-Tags" by L. Reindl and W. Ruile, 1983 IEEE Ultrasonics Symposium, Proceedings, pages 125 et seqq is also of importance.

The technology of autonomous sensor modules which can be checked without the use of wires has developed in recent years on the basis of a requirement for monitoring measurement variables such as wear, pressure and temperature in the tires of a passenger or goods vehicle. A completely passive sensor module comprising a surface acoustic wave element, an antenna and a sensor as well as any matching networks that may be required promises particular advantages for this purpose. A sensor module such as this does not require its own power supply, since the measurement variable which is determined by the sensor can be checked at any desired time by means of a high-frequency pulse transmitted to the module. This is explained in detail in the articles mentioned initially. A sensor module such as this can be checked by an evaluation appliance at a distance of several meters using radio frequency signals from an appropriate frequency band (for example the frequency band around 434 MHz). Possible sensors include a temperature sensor and a pressure sensor, and the sensor module is sufficiently small and compact to allow it to be installed in a conventional automobile tire.

As is evident from the three documents cited initially, the amplitude of the signal which is reflected on the reflector (which is connected to the sensor) of the surface acoustic wave element is the variable to be evaluated for the measurement, and thus governs the achievable measurement resolution. A pressure sensor in particular has a reactance as the measurement variable and can be connected to the reflector via a matching network such that it forms a resonator which allows the amplitude of a surface acoustic wave which is reflected by the reflector to be varied in accordance with the variability of the measurement variable. The evaluation of the amplitude of the reflected surface acoustic wave has the disadvantage that it is necessary to take into account a measurement error which is a function of this amplitude. The smaller the amplitude, the smaller is the separation between the amplitude and the noise, which is always present, and, in a corresponding way, the poorer is the achievable resolution. Since a minimum separation between the signal and the noise (signal to noise ratio) must not be undershot for sensible evaluation, the measurement dynamic range is thus restricted. There is also a restriction with regard to the distance between the evaluation appliance and the sensor module, since the amplitude which can be received by the evaluation appliance falls as the distance increases. In a corresponding way, the present prior art excludes long range measurements and high resolution measurements.

SUMMARY OF THE INVENTION

The invention is thus based on the object of specifying a product, a method and an arrangement of the type mentioned initially, each of which avoids the described disadvantages and allows measurement of a measurement variable which corresponds to a reactance, and which measurement is not restricted by the necessity to reach a compromise between the achievable resolution and the achievable range.

In order to achieve this object, a product is specified having a sensor, by means of which a measurement variable which corresponds to a reactance and which is within a measurement range can be supplied, having a matching network and having a surface acoustic wave element, with the sensor being connected via the matching network to a first reflector in the surface acoustic wave element, and with the first reflector together with the matching network and the sensor forming a resonator. For a value of the measurement variable within the measurement range, the resonator has a resonance with respect to a reflection of a surface acoustic wave, which propagates on the surface acoustic wave element, on the first reflector.

In order to achieve this object, a method is specified for determining a measurement variable, which corresponds to a reactance, within a measurement range by a sensor, which is connected via a matching network to a first reflector in a surface acoustic wave element, and which, together with the first reflector and the matching network, forms a resonator, which resonator has, for a value of the measurement variable within the measurement range, a resonance with respect to a reflection of a surface acoustic wave, which propagates on the surface acoustic wave element, on the first reflector, comprising the following steps:

a) production of a surface acoustic wave which propagates on the surface acoustic wave element;

b) production of a first reflected acoustic wave by reflection of the surface acoustic wave on the first reflector;

c) reception of the first reflected surface acoustic wave; and d) determination of the measurement variable from a phase of the first reflected surface acoustic wave.

In order to achieve this object, an arrangement is specified for determining a measurement variable, which corresponds to a reactance, by a sensor, which is connected via a matching network to a first reflector in a surface acoustic wave element, and which, together with the first reflector and the matching network, forms a resonator, which resonator has, for a value of the measurement variable within the measurement range, a resonance with respect to a reflection of a surface acoustic wave, which propagates on the surface acoustic wave element, on the first reflector, comprising means for:

a) production of a surface acoustic wave which propagates on the surface acoustic wave element;

b) production of a first reflected surface acoustic wave produced by reflection of the surface acoustic wave on the first reflector; and c) determination of the measurement variable from a phase of the first reflected surface acoustic wave.

According to the invention, the evaluation of an amplitude of a reflected surface acoustic wave is accordingly replaced by an evaluation of a phase of the reflected surface acoustic wave. This requires a specific measure in the sensor module, since the variability of the phase as a function of a reactive measurement variable is at its greatest when the relationship between the amplitude of the reflected surface acoustic wave and the measurement variable is at its lowest. This is the situation when the frequency used for checking is a resonant frequency of the resonator that is formed from the sensor, the matching network and the first reflector. This precludes evaluation of the amplitude of the reflected surface acoustic wave, since the amplitude is no longer uniquely dependent on the measurement variable, at least in a portion of the measurement range. This also means that the dynamic range of the amplitude of the reflected surface acoustic wave is considerably reduced in comparison to the capabilities of the prior art, so that the problem of maintaining a necessary minimum signal to noise ratio is considerably reduced. The dependency of the measurement variable itself on the amplitude that is directly to be measured is also reduced, which means that the measurement error to be considered is considerably less dependent on the measurement variable.

Preferred developments of the invention will now be described; it is self-evident that these are intended for all three embodiments of the invention as described above, namely the product, the method and the arrangement.

One preferred development is for the resonance to be governed by a maximum reflectivity of the first reflector. This maximizes the amplitude of the reflected surface acoustic wave, which considerably improves the achievable measurement resolution.

It is likewise preferable for the resonance to be unique within the measurement range; this also ameliorates any possible low dynamic range of the amplitude of the reflected surface acoustic wave.

The measurement variable is preferably a capacitance, thus corresponding to the choice of a capacitive sensor, in particular of a pressure sensor. In this case, furthermore, the matching network is preferably an inductance connected in series with the sensor.

The surface acoustic wave element is preferably equipped with a second reflector, which is also preferably not switched. The second reflector is used to form a second reflected surface acoustic wave in addition to the first reflected surface acoustic wave, which has been mentioned. This second reflected surface acoustic wave can be used as a reference signal for determining the phase of the first reflected surface acoustic wave. The phase measurement can thus be carried out largely independently of environmental influences.

This is particular important when the sensor is used in a rotating motor vehicle tire. This is because this results in variability of the phase between the rotating sensor and the evaluation appliance which is installed in a fixed position in the motor vehicle, which variability could in some circumstances adversely affect the measurement, but not the measurement using the second reflected surface acoustic wave. It should also be remembered that the measurement can be adversely affected if the temperature of the surface acoustic wave element fluctuates. Any influence such as this can be determined using a second reflector or a number of second reflectors, with the determination of the desired measurement variable being corrected if necessary. A second sensor in the circuit can be provided for an additional measurement for the purpose of comparison, calibration or compensation for an influence which would otherwise be disturbing.

It is particularly preferable for the surface acoustic wave element to have an electroacoustic transducer, to which an antenna is connected. This allows the surface acoustic wave to be produced by sending a pulsed, incoming electromagnetic radio frequency signal to the antenna; the first reflected surface acoustic wave, or any reflected surface acoustic wave, is also transmitted by being converted by the transducer to an appropriate outgoing electromagnetic signal, which is transmitted via the antenna.

In this context, an evaluation appliance which is mechanically separate from the sensor and from the surface acoustic wave element is preferably provided, which has a transceiver for producing the incoming electromagnetic signal to be sent to the antenna and to be converted by the transducer, and for receiving every outgoing electromagnetic signal converted by the transducer, as well as a phase discriminator for determining the measurement variable. This phase discriminator can be configured on the basis of the knowledge of a relevantly experienced person employed for this purpose; in the simplest case, the phase of the received signal can be determined relative to the phase of an oscillator which has produced the electromagnetic signal sent to the sensor. A corresponding phase discriminator can be produced using conventional analog radio frequency technology. Alternatively, the phase discriminator may operate such that it first of all stores a respective outgoing electromagnetic signal both for the first reflected surface acoustic wave and for the second reflected surface acoustic wave, and then compares the two stored signals with one another; this may be done using a signal processor which is based on digital technology and is provided with an appropriate program.

BRIEF DESCRIPTION OF THE DRAWINGS

Exemplary embodiments of the invention will now be explained with reference to the drawing. Some of the figures in the drawing are shown schematically; in no case is the drawing intended to represent a scale reproduction. In order to complete the following statements and the information which is directly evident from the drawing, reference is made to the readily available specialist knowledge of the appropriately skilled persons employed for this purpose, and to the cited documents relating to the prior art. In detail.

DETAILED DESCRIPTION OF THE PREFERRED EMBODIMENTS

Figure 1:
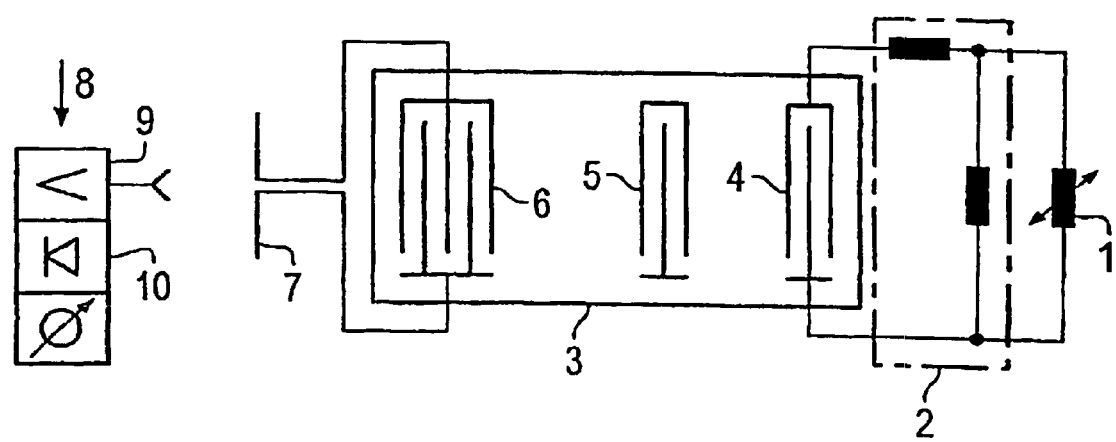
FIG. 1 shows an arrangement as described above, having a product as described above.

FIG. 1 shows a product having a sensor 1, which is connected via a matching network 2 to a surface acoustic wave element 3, to be precise to a first reflector 4 in this surface acoustic wave element 3.

The first reflector 4 interacts with a surface acoustic wave which is propagating on the surface acoustic wave element 3, which consists of a piezoelectric substrate, in particular composed of lithium niobate. This takes place in such a way that the surface acoustic wave produces an electrical signal in the first reflector 4, which signal itself reacts on the piezoelectric substrate, thus forming a first reflected surface acoustic wave. This also propagates on the surface acoustic wave element 3, starting from the first reflector 4. This reflection characteristic of the first reflector 4 is dependent on its external circuitry, as provided by the matching network 2 and the sensor 1. Both the sensor 1 and the matching network 2 are each primarily in the form of a reactance or a network of such reactances. The first reflector 4 together with the matching network 2 and the sensor 1 forms a resonator with regard to reflection of a surface acoustic wave, which is propagating on the surface acoustic wave element 3, on the first reflector 4, as indicated above. The resonator has characteristics which vary in accordance with a change in the reactance of the sensor 1, with this change taking place within a measurement range which is predetermined by the design of the sensor 1. The reactance of the sensor 1 is the desired measurement variable. By appropriate choice of the matching network 2 as a function of the significant characteristics of the sensor 1, the resonator is designed such that, for a value of the measurement variable within the measurement range, it has a resonance with regard to a reflection of a surface acoustic wave, which propagates on the surface acoustic wave element 3, on the first reflector 4. This has the advantage that the phase of the first reflected surface acoustic wave produced by the reflection varies with the measurement variable, although the amplitude of the first reflected surface acoustic wave remains comparatively constant. By evaluation of the phase of the first reflected surface acoustic wave, it is thus possible to carry out a precise measurement, allowing high resolution, of the measurement variable. The resonance is expediently governed by a maximum reflectivity of the first reflector, so that, on entering resonance, the amplitude of the first reflected surface acoustic wave is at a maximum. This ensures that the amplitude of the first reflected surface acoustic wave is as high as possible over the entire measurement range. The same purpose is served by the resonance being unique within the measurement range, since two directly successive resonances of an electromagnetic circuit always have the characteristic that one resonance is governed by the maximum amplitude, and the other resonance is governed by the minimum amplitude. A single resonance with maximum reflectivity as described ensures that the reflected surface acoustic wave has as high an amplitude as possible over the entire measurement range.

In addition to the first reflector 4, the surface acoustic wave element 3 also has a second reflector 5, which is not switched. This second reflector 5 forms a second reflected surface acoustic wave, and the phase of the first reflected surface acoustic wave which is desired for determining the measurement variable is expediently determined by comparison with the phase of the second reflected surface acoustic wave, which is always constant owing to the lack of circuitry for the second reflector 5. The second reflected surface acoustic wave may, if necessary, also be used in order to preclude any disturbance influence, for example resulting from a fluctuating temperature of the surface acoustic wave element 3.

The surface acoustic wave element 3 also has an electroacoustic transducer 6. This defines a unique relationship between a surface acoustic wave which is propagating on the surface acoustic wave element 3, and an electrical signal which is applied to the electroacoustic transducer 6. The transducer 6 is used to transform an electromagnetic signal, which arrives via the antenna 7, into a surface acoustic wave, which then propagates to the first reflector 4 and to the second reflector 5, and to convert the reflected surface acoustic waves, which are produced by these reflectors 4 and 5, back to corresponding electromagnetic signals originating via the antenna 7.

The described product is part of an arrangement for determining the measurement variable, which corresponds to a reactance, of the sensor 1 and which, in addition to the product, has an evaluation appliance 8. The transducer 6, the antenna 7 and the evaluation appliance 8 form means for producing a surface acoustic wave which propagates on the surface acoustic wave element, for receiving a first reflected surface acoustic wave which is produced by reflection of the surface acoustic wave on the first reflector 4, and for determining the measurement variable from a phase of the first reflected surface acoustic wave. To this end, the evaluation appliance has a transceiver 9 and a phase discriminator 10. The transceiver 9 is used for producing an incoming electromagnetic signal, which is to be sent to the product, and for receiving an outgoing electrical signal, which is formed by conversion of the first reflected surface acoustic wave in the product. The phase of the outgoing electromagnetic signal, and hence the phase of the first reflected surface acoustic wave as well as, derived from this, the measurement variable, are determined in the phase discriminator 10. In the simplest case, in order to pass on the measurement variable, the evaluation appliance 8 has an appropriate indication device, as shown. The details relating to the configuration of the evaluation appliance 8 will not be described at this point, since these details are familiar to a sufficient extent to a relatively experienced person employed for this purpose. In addition, reference is made to the above statements relating to an advantageous embodiment of the invention.

Figure 2:
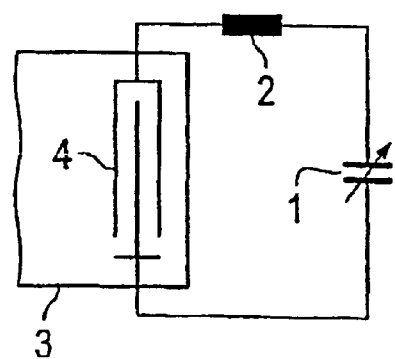
FIG. 2 shows one specific refinement of the product as shown in FIG. 1.

FIG. 2 shows one preferred refinement of the product. The sensor 1 is in this case a capacitive sensor, for example a pressure sensor, in a tire on a motor vehicle. Electrically, the pressure sensor corresponds to a capacitor with a variable capacitance within a measurement range, and the capacitance is also the significant measurement variable in this case. The matching network 2 in the present case is merely an inductance 2 which is connected in series with the sensor 1, and the series resonant circuit formed in this way from the sensor 1 and the inductance 2 is connected to the first reflector 4 on the surface acoustic wave element 3. The resonator, which is formed in this way from the first reflector 4 and the series resonant circuit, has only a single resonance, also and in particular a single resonance within the measurement range. This reflector is also set up such that the reflectivity of the first resonator 4 is at a maximum at the resonance point; a first reflected surface acoustic wave with a maximum amplitude is thus produced at the resonance point, and, furthermore, the amplitude is in any case always relatively high within the measurement range. This contributes to achieving a small measurement error, and thus high resolution.

Figure 3:
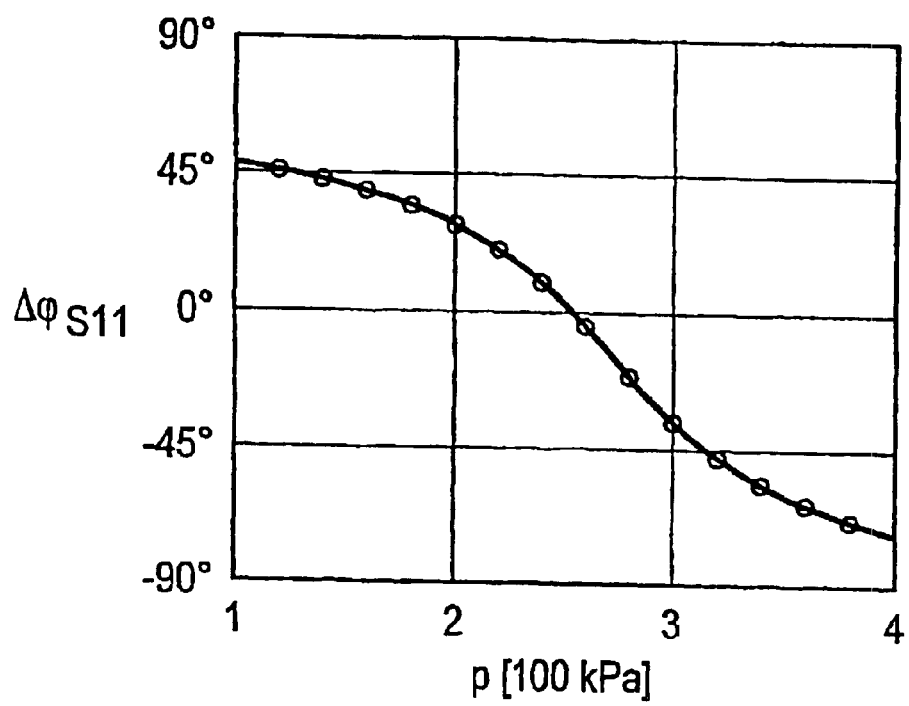
FIG. 3 and FIG. 4 show measurement results, obtained using a product as illustrated in FIG. 2.
Figure 4:
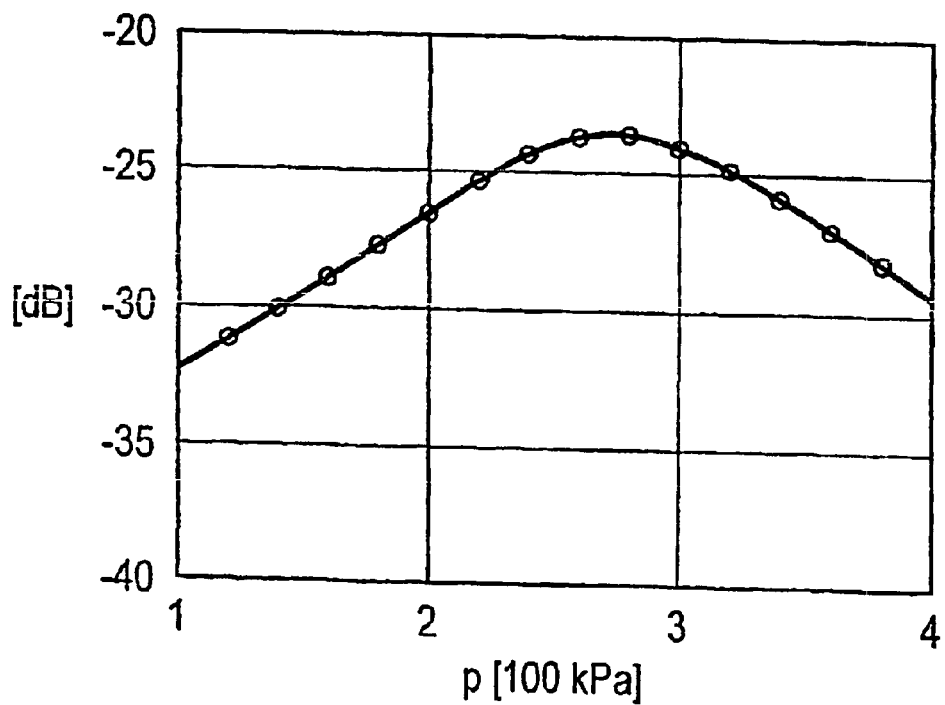

FIGS. 3 and 4 show measurement values obtained using a product as shown in FIG. 2. This product is designed for a surface acoustic wave frequency of 433.92 MHz, corresponding to one frequency from a standardized ISM frequency band. The surface acoustic wave element 3 is composed of lithium niobate with a length of 13 mm and a width of 2 mm, with a propagation time for the surface acoustic wave from the transducer 6 to the first reflector 4 and back of 7 $\mu$s, and with a first reflector 4 and a transducer 6 composed of aluminum. A differential pressure sensor composed of quartz is used as the sensor 1, with a measurement range between 1.5 pF, corresponding to 100 kPa pressure difference, to 5 pF, corresponding to 400 kPa pressure difference, and with a resistive loss of 3 ohms. The sensor 1 comprises a square membrane with a side length of 20 mm; a sensor with considerably smaller dimensions is considered for practical use. A coil 2 connected in series with the sensor 1 and having an inductance of 100 nH is used as the matching network 2. This product is based on the phase to be evaluated in order to determine the measurement variable having a variability of more than 90°, as can be seen from FIG. 3. The variability of the amplitude of the reflected surface acoustic wave is shown in FIG. 4; this is approximately 10 dB and is thus quite small; it can also be seen that the relationship between the amplitude and the measured pressure is not unambiguous. FIG. 4 shows the amplitude of the first reflected surface acoustic wave relative to the amplitude of the surface acoustic wave running from the transducer 6 to the first reflector 4, illustrated logarithmically; the factor which can be seen from FIG. 4 is frequently referred to as the "return loss." The variability of the amplitude as shown in FIG. 4 is in each case sufficient to ensure an adequate signal-to-noise ratio in every case in suitable boundary conditions for the purposes of an arrangement as shown in FIG. 1, while at the same time ensuring high measurement variable sensitivity, as can be seen in FIG. 3. The described product is thus ideally suitable for determining an operating parameter for a tire in a motor vehicle, with the surface acoustic wave element 3 being fitted together with the antenna 7, the matching network 2 and the sensor 1 in the tire, and the evaluation unit 8 being positioned separately from the tire.

What is claimed is:

1. A product comprising a sensor, by means of which a measurement variable which corresponds to a reactance and which is within a measurement range can be supplied, having a matching network and having a surface acoustic wave element, with the sensor being connected via the matching network to a first reflector in the surface acoustic wave element, and the first reflector together with the matching network and the sensor forming a resonator, wherein the matching network is formed in such a way that, for a value of the measurement variable within the measurement range, the resonator has a resonance with respect to a reflection of a surface acoustic wave, which propagates on the surface acoustic wave element, on the first reflector.

2. The product as claimed in claim 1, in which the resonance is governed by the maximum reflectivity of the first reflector.

3. The product as claimed in claim 1, in which the resonance is unique within the measurement range.

4. The product as claimed in claim 1, in which the measurement variable is a capacitance.

5. The product as claimed in claim 4, in which the matching network is an inductance connected in series with the sensor.

6. The product as claimed in claim 1, in which the surface acoustic wave element has a second reflector.

7. The product as claimed in claim 6, in which the second resonator is not switched.

8. The product as claimed in claim 1, in which the surface acoustic wave element has an electroacustic transducer, to which an antenna is connected.

9. A method for determining a measurement variable, which corresponds to a reactance, within a measurement range by a sensor, which is connected via a matching network to a first reflector in a surface acoustic wave element, and which, together with the first reflector and the matching network, forms a resonator, comprising the following steps:

a) providing the matching network in such a way that the resonator has, for a value of the measurement variable within the measurement range, a resonance with respect to a reflection of a surface acoustic wave, which propagates on the surface acoustic wave element, on the first reflector;

b) generating a surface acoustic wave which propagates on the surface acoustic wave element;

c) generating a first reflected acoustic wave by reflection of the surface acoustic wave on the first reflector;

d) receiving the first reflected surface acoustic wave; and e) determining the measurement variable from a phase of the first reflected surface acoustic wave.

10. The method as claimed in claim 9, in which the surface acoustic wave is converted from an incoming electromagnetic signal and the reflected surface acoustic wave to an outgoing electromagnetic signal, and the measurement variable is determined from the outgoing electromagnetic signal.

11. The method as claimed in claim 10, in which the incoming signal is received via an antenna, and the outgoing signal is transmitted via the antenna.

12. The method as claimed in claim 9, in which a second reflected surface acoustic wave is produced by reflection of the surface acoustic wave on a second reflector in the surface acoustic wave element, the second reflected surface acoustic wave is likewise received, and the measurement variable is determined from a phase difference between the first and the second reflected surface acoustic waves.

13. An arrangement for determining a measurement variable, which corresponds to a reactance, within a measurement range comprising a sensor, which is connected via a matching network to a first reflector in a surface acoustic wave element, and which, together with the first reflector and the matching network, forms a resonator, wherein the matching network is formed in such a way that the resonator has, for a value of the measurement variable within the measurement range, a resonance with respect to a reflection of a surface acoustic wave, which propagates on the surface acoustic wave element, on the first reflector, and wherein the arrangement further comprises:

a) means for production of a surface acoustic surface wave which propagates on the surface acoustic wave element;

b) means for production of a first reflected surface acoustic wave produced by reflection of the surface acoustic wave on the first reflector; and c) means for determination of the measurement variable from a phase of the first reflected surface acoustic wave.

14. The arrangement as claimed in claim 13, wherein the arrangement comprises an electroacoustic transducer on the surface acoustic wave element, an antenna connected to it, and an evaluation appliance which is mechanically separate from the sensor and from the surface acoustic wave element.

15. The arrangement as claimed in claim 14, wherein the evaluation appliance has a transceiver for producing an incoming electromagnetic signal, which is to be transmitted to the antenna and is to be converted by the transducer, and for receiving an outgoing electromagnetic signal, which is converted by the transducer, and has a phase discriminator for determining the measurement variable.

* * * * *